United States Patent
Bernard et al.

(10) Patent No.: US 10,644,223 B2
(45) Date of Patent: May 5, 2020

(54) PERFORATED PIEZOELECTRIC HYDROPHONE, ARRAY COMPRISING A PLURALITY OF HYDROPHONES AND METHOD FOR MAKING SAID HYDROPHONE

(71) Applicant: THALES, Courbevoie (FR)

(72) Inventors: Julien Bernard, Sophia Antipolis (FR); Maryline Nakache, Sophia Antipolis (FR); Robert Decarlis, Sophia Antipolis (FR); Roger Thannberger, Sophia Antipolis (FR); Antoine Caplain, Sophia Antipolis (FR); Guy Bertrand, Sophia Antipolis (FR)

(73) Assignee: THALES, Courbevoie (FR)

( * ) Notice: Subject to any disclaimer, the term of this patent is extended or adjusted under 35 U.S.C. 154(b) by 540 days.

(21) Appl. No.: 15/534,931

(22) PCT Filed: Dec. 10, 2015

(86) PCT No.: PCT/EP2015/079258
§ 371 (c)(1),
(2) Date: Jun. 9, 2017

(87) PCT Pub. No.: WO2016/092020
PCT Pub. Date: Jun. 16, 2016

(65) Prior Publication Data
US 2018/0269376 A1   Sep. 20, 2018

(30) Foreign Application Priority Data

Dec. 10, 2014 (FR) .................... 14 02806

(51) Int. Cl.
*H01L 41/18*  (2006.01)
*H01L 41/053*  (2006.01)
(Continued)

(52) U.S. Cl.
CPC ............ *H01L 41/183* (2013.01); *G01V 1/186* (2013.01); *G01V 1/208* (2013.01); *H01L 41/1132* (2013.01)

(58) Field of Classification Search
CPC ... H01L 41/183; H01L 41/1132; G01V 1/186; G01V 1/208
(Continued)

(56) References Cited

U.S. PATENT DOCUMENTS 4,422,003 A   12/1983 Safari et al.
5,334,903 A   8/1994 Smith
(Continued)

OTHER PUBLICATIONS

R. Gentilman et al., "Sonopanel 1-3 piezocomposite hydrophone-actuator panels," Oceans '95 MTS/IEEE, 1995, pp. 2032-2035, XP002746855.
(Continued)

*Primary Examiner* — Thomas M Dougherty
(74) *Attorney, Agent, or Firm* — Baker & Hostetler LLP

(57) ABSTRACT

A piezoelectric hydrophone with perforations and an array comprising a plurality of hydrophones comprises a stack of layers that are bonded to one another, the layers comprising at least one piezoelectric layer and a plurality of layers referred to as rigid layers, at least two of which are electrode layers, the rigid layers exhibiting a stiffness perpendicularly to the direction of stacking, which stiffness is higher than the stiffness of the piezoelectric layer perpendicularly to the direction of stacking. At least one piezoelectric layer comprises a central zone comprising a set of perforations that pass through the piezoelectric layer solely along the direction of stacking, each perforation being closed tight by closure elements comprising portions of two of the rigid layers, the two rigid layers extending over the entirety of the surface of the central zone.

18 Claims, 4 Drawing Sheets

(51) Int. Cl.
*G01V 1/18* (2006.01)
*G01V 1/20* (2006.01)
*H01L 41/113* (2006.01)

(58) Field of Classification Search
USPC ........................................ 311/311–371, 800
See application file for complete search history.

(56) References Cited

U.S. PATENT DOCUMENTS

| | | | | |
|---|---|---|---|---|
| 6,806,622 | B1* | 10/2004 | Schmidt | B06B 1/067 310/327 |
| 2004/0032188 | A1* | 2/2004 | Bhardwaj | B06B 1/0607 310/334 |
| 2009/0108710 | A1* | 4/2009 | Brown | B06B 1/0622 310/367 |

OTHER PUBLICATIONS

E. K. Akdogan et al., "Piezoelectric composites for sensor and actuator applications," IEEE Transactions on Ultrasonics Ferroelectrics and Frequency Control, vol. 52, No. 5, May 1, 2005, pp. 746-775, XP055220526.

D. Robertson et al., "Experimental investigation of alternative pre-stress components for a 3-1 connectivity multilayer piezoelectric-polymer composite ultrasonic transducer," Ultrasonics, IPC Science and Technology Press Ltd., vol. 40, No. 1-8, May 1, 2002, pp. 913-919, XP004357319.

* cited by examiner

PERFORATED PIEZOELECTRIC HYDROPHONE, ARRAY COMPRISING A PLURALITY OF HYDROPHONES AND METHOD FOR MAKING SAID HYDROPHONE

CROSS-REFERENCE TO RELATED APPLICATIONS

This application is a National Stage of International patent application PCT/EP2015/079258, filed on Dec. 10, 2015, which claims priority to foreign French patent application No. FR 1402806, filed on Dec. 10, 2014, the disclosures of which are incorporated by reference in their entirety.

FIELD OF THE INVENTION

The field of the invention is that of sonar, in particular passive sonar, receiving arrays intended for submarine use. Sonar-detecting arrays comprise a plurality of hydrophones. Hydrophones are intended to measure sound pressure, for example in order to detect submarine objects. Hydrophones are conventionally mounted on a support structure, such as for example the hull of a submarine or of a surface vessel, or a flute intended to be towed by ship. Typically, a hydrophone is very small in size in comparison to the acoustic wavelength. The sound pressure can then be considered to be a hydrostatic pressure, i.e. its amplitude and phase are identical over all faces of the hydrophone. Piezoelectric materials are used to convert the sound pressure to an electrical signal. Their sensitivity in hydrostatic mode, i.e. when the normal stresses are identical in three directions, is generally poor. Most hydrophone designs are therefore based on amplifying or decreasing the stress in one or more directions in order to allow the hardware to operate in a more favorable mode. Current elementary sensors include multi-layer sensors with electrodes referred to as rigid electrodes. These sensors comprise a stack of a variable number of layers of piezoelectric material, generally stress-polarized PVDF (polyvinylidene fluoride), and electrodes made of rigid metal, for example Al, Cu—Be, or Cu—Sn. The term "rigid electrode" is understood as an electrode exhibiting a stiffness in the plane of the electrode layer that is higher than the stiffness of the layer of piezoelectric material in the plane of the piezoelectric layer. A function of these rigid electrodes is to limit the lateral deformation of the PVDF, which has two consequences. The first, positive consequence is a substantial decrease in the lateral stress in the PVDF due to the pressure applied in the lateral direction. The other, negative consequence is the generation, owing to the Poisson effect, of a lateral stress due to the pressure applied in the vertical direction. In practice, the lateral stress in the PVDF is thus decreased by around 20% with respect to the exterior pressure, the vertical stress remaining unchanged. The PVDF material then operates in thickness mode (also referred to as blocked mode). The sensitivity is improved by 2 to 4 dB with respect to the hydrostatic mode. The layers of PVDF are made in a uniform piezoelectric material, i.e. comprising only PVDF, as opposed to a composite piezoelectric material comprising a piezoelectric material and at least one other material. Throughout the rest of the text, this type of sensor will be referred to as a "multilayer sensor with rigid elastic plates and uniform piezoelectric plates". This type of sensor exhibits good sensitivity, a high level of saturation and low manufacturing dispersion, acceleration compensation that is simple to achieve by connecting layers of opposite polarization in series or in parallel, an ability to produce large, continuous acoustic surfaces, very low thickness, very high mechanical robustness and strength when submerged due to the absence of mechanical amplification, low labor cost due to the small number of parts and procedures and low accelerometric sensitivity in comparison to hydrophonic sensitivity.

BACKGROUND

An advantage of this type of hydrophone is that it does not have a resonant mode with a high electromechanical coupling coefficient in or near its useful operating band, thereby avoiding the problem of dispersion of the hydrophonic sensitivity Sh of the sensor and the risk of saturation in the presence of a scrambler if the resonance-induced overvoltage is too high. In the sensor, bending modes exist in the useful band but they exhibit very low mechanical coupling due to the twin layer assembly, i.e. an assembly in which the piezoelectric layer is sandwiched between two electrodes. Furthermore, the transducer is highly resistant to hydrostatic pressure; indeed, since the loading is hydrostatic in nature (substantially equal in three directions), the Von Mises stress in the materials remains low. This absence of resonant modes with a high coupling coefficient in or near the operating frequency band of the device makes it possible to produce sensors according to the invention of large size without necessarily having to group multiple elementary sensors together, generally four being used to obtain the required surface filtering effect or to obtain good acceleration compensation. This makes it possible to keep the costs of the sensor down by obviating the need for additional wiring procedures and additional parts for the relative positioning of the elementary sensors.

The current trend is to increase the frequencies of the acoustic waves emitted by the objects sought by passive sonar. However, since the various forms of self-noise (noise radiated by the hydrophone-bearing structure or support, noise due to the direct flow of water against the hydrophone) decrease rapidly with frequency, the noise level at the beamforming output becomes limited by the electrical noise of the hydrophone channel, which makes it necessary to produce electroacoustic transducers having the lowest possible electrical noise. Furthermore, the increasingly common use of devices for isolating the array with respect to mechanical noise (such as sound baffling devices), or of adaptive processing algorithms, also has the effect of further decreasing the mechanical noise level at the beamforming output. Additionally, the decrease in self-noise is even more substantial when the support structure is coated with a masking and/or anechoic material, the aim of which is to improve the acoustic quieting of the support structure (noise radiated by the support structure) and stealth (emission of target echoes with respect to active sonar). Specifically, this type of coating decreases the mechanical noise level at the beamforming output further still, which noise is the main contributor to self-noise when the hydrophone is fixed or moving at low speed. The suppression of the signal response gain due to reflection off the support makes the need to decrease electrical noise, expressed in terms of equivalent isotropic noise level, all the more critical.

Specifically, the electrical noise, in terms of equivalent isotropic noise level, of a hydrophone is given by $$N_{FV}^A = \frac{N_{FV} H G^A}{S_{FV}},$$

where $N_{FV}$ is the electrical noise level at the beamforming output, $HG^A$ is the gain of the hydrophone in terms of isotropic ambient noise, i.e. directivity factor (DF), and $S_{FV}$ is the response level in terms of array signal. For an identical level of electrical noise (in $V^2$/Hz), the decrease in the level of the signal response $S_{FV}$ results in an increase in the level of electrical noise $N_{FV}$ expressed in terms of equivalent isotropic noise (in $Pa^2$/Hz), the directivity factor being little affected by the coating of the support.

It is therefore essential to propose a hydrophone that meets stricter requirements in terms of electrical noise of the hydrophonic channel. Stated otherwise, it is essential to propose a hydrophone having low electrical noise in order to facilitate operation at higher frequencies. The electrical noise of the hydrophonic channel is chiefly determined by the electrical noise of the hydrophone (in terms of equivalent isotropic noise) given by the inverse of $Sh^2Ch/\tan(\delta)$, where Sh is the hydrophonic sensitivity expressed in terms of V/µPa, Ch is the capacitance expressed in farads, and $\tan(\delta)$ is the dielectric losses. However, the main problem of the multilayer elementary sensor with uniform piezoelectric plates resides in the fact that the dielectric losses of the PVDF material increase substantially with frequency, resulting in an increase in the electrical noise of the elementary sensor.

In order to obtain an acceptable level of electrical noise, the usual approach consists in maximizing the volume of active material. This may be achieved by either maximizing the area of the sensor (increasing the capacitance Ch), or by increasing its thickness through the addition of additional layers of PVDF (increasing Sh). However, this solution does not allow the requirement in terms of angular coverage of the array at the highest frequencies to be met, since this requirement involves a decrease in the area of the elementary sensor. Furthermore, it does not allow a constraint to be met on the integration of the sensor within a given volume of thickness, which does not allow the thickness of the PVDF material to be increased indefinitely for the purpose of improving the sensitivity or the capacitance of the elementary sensor. This volume-related constraint is in particular due to the passband of the hydrophonic sensitivity on the support structure.

In order to improve the electrical noise of the multilayer sensor without increasing the volume of piezoelectric material, another approach consists in using materials with a better figure of merit (product of $Sh^2Ch/\tan(\delta)$ per unit volume). These materials are chiefly piezoelectric composites, or piezocomposites, for which there is a specific classification scheme. The classification of piezoelectric composites is based on phase topology rather than on their geometry. For example, an m-n piezocomposite, where m∈{0, 1, 2, 3} and n∈{0, 1, 2, 3}, refers to a two-phase composite the first phase (phase 1) of which is connected along m directions and the second phase (phase 2) of which is connected along n directions. The connectivity solely determines the number of directions along which the various domains of one and the same phase are connected. The shape and size of the phases may be arbitrary. Typically, only one phase is piezoelectric, the other being a non-piezoelectric solid or fluid material such as a polymer or air. Phase 1 is generally used to refer to the piezoelectric material and phase 2 to the non-piezoelectric material. For a piezocomposite of given connectivity, multiple configurations are possible along the directions of connectivity with respect to the direction of polarization of the piezomaterial.

A first group of higher performance materials consists of piezoelectric polymers, such as for example the copolymer P(VDF-TrFE) or porous PVDF. The copolymer P(VDF-TrFE) is a single-phase piezoelectric polymer which is around 50% more sensitive in hydrostatic mode and in blocked mode than PVDF, to the detriment of permittivity which is around 30% lower. Porous PVDF is a piezoelectric composite that consists of a PVDF matrix with fully encapsulated microscopic air inclusions. Porous PVDF is therefore a piezocomposite with 3-0 connectivity. The addition of microfissures to the PVDF makes it possible to double the sensitivity of the material in hydrostatic mode, to the detriment of permittivity, which is around 20% lower. However, no additional improvement is observed in blocked mode, mainly due to the high Poisson's ratio. These materials make it possible to decrease the electrical noise of the sensor by a few dB for a given volume, but with a corresponding increase in the supply cost. Furthermore, the static pressure resistance of porous PVDF is limited and its properties are irreversibly degraded above 70 bar.

A second group of higher performance materials consists of 1-3 composite materials. Columns of piezoelectric material are positioned in parallel to one another along a direction of polarization that is perpendicular to the plane of the layer, and are spaced apart from one another. The columns are embedded within a matrix of polymer material that exhibits low stiffness in comparison to that of the piezoelectric material. The effective mechanical stiffnesses of the composite in the vertical and lateral directions are substantially lower than those of the initial piezoelectric material. In the presence of rigid electrodes, this results in the vertical stress in the piezoelectric columns being amplified, the lateral blocking effect of the electrodes being enhanced, and the effective Poisson's ratio being decreased. Unfortunately, in this type of composite, the filler material is exposed to static pressure on the lateral faces of the plate. The choice of filler material therefore results from a trade-off between performance and resistance to submersion, i.e. between low stiffness and high yield strength. Relatively rigid and resistant polymers are therefore typically used, which limits the potential sensitivity gain and restricts the field of application to rigid piezoelectric materials (ceramics or piezoelectric single crystals). 1-3 composites allow the electrical noise of the sensor to be substantially decreased but provide mediocre sensitivity at a given thickness, which tends to have a negative impact on the electrical noise of the entire channel (then chiefly dominated by the noise of the pre-amplification chain). In order to compensate for this phenomenon, a portion of the area of the sensor must be exchanged for thickness in order to improve sensitivity, to the detriment of the ease of integration of the sensor. Piezoelectric composites with 2-2, 3-1 or 3-2 connectivity can also be used. However, the configurations explored until now suffer from the same limitations, due to the fact that the filler material is still in communication with the exterior and subjected to static pressure.

SUMMARY OF THE INVENTION

The aim of the invention is to overcome all or some of the aforementioned drawbacks.

To achieve this, one subject of the invention is a hydrophone configured to operate in push-pull mode comprising a stack of layers that are bonded to one another, the stack being produced along a direction of stacking, the layers comprising at least one piezoelectric layer and a plurality of layers referred to as rigid layers, at least two of which are electrode layers, the rigid layers exhibiting a stiffness perpendicularly to the direction of stacking, which stiffness is higher than the stiffness of the piezoelectric layer perpendicularly to the direction of stacking. In the hydrophone according to the invention, at least one piezoelectric layer comprises a central zone comprising a set of perforations that pass through the piezoelectric layer along the direction of stacking. Each perforation is closed tight by closure elements comprising portions of two of said rigid layers, said two rigid layers extending over the entirety of the surface of the central zone.

The provided solution consists in improving the multilayer hydrophone with uniform piezoelectric plates by modifying its design. More specifically, it is based on making perforations in the layers of piezoelectric material. These perforations are filled with a filler material which may be a solid material or a fluid, for example a gas or even vacuum. The piezoelectric material of the layer, connected along three directions, and the filler material, connected only in the direction of stacking, form a piezocomposite with 3-1 connectivity. A function of the perforations is to provide lateral decoupling in the direction perpendicular to the perforations, thus allowing the piezoelectric material to operate in a more favorable mode than in a multilayer sensor with uniform plates and allowing the sensitivity of the sensor to be improved. Furthermore, the perforations provide a stress amplification effect in the direction of stacking by virtue of the ratio of the areas of the rigid layers to those of the layers of piezoelectric material, which is added to the preceding effect and allows the sensitivity of the sensor to be enhanced further still.

The sensor according to the invention retains the same main advantages of the multilayer sensor with uniform plates, namely a flat response in the operating frequency band, low accelerometric sensitivity in comparison with its hydrophonic sensitivity, good surface filtering making it possible to filter noise characterized by very short wavelengths on the surface of the sensor, a high level of saturation characterized by the sound level that is acceptable to the hydrophonic channel, low manufacturing dispersion, acceleration compensation due to insensitivity to an antisymmetric pressure field, simplicity of production by virtue of the series or parallel connection of layers of opposite polarization, an ability to produce large, continuous acoustic surfaces and very low thickness.

The proposed design modification leads, all else being equal, to a substantial increase in the sensitivity Sh, a slight decrease in the capacitance Ch, and a clear increase in the factor of merit $Sh^2Ch/\tan(\delta)$, which may be more or less substantial depending on the symmetry type and the Poisson's ratio of the piezoelectric material used. Consequently, the invention leads to a decrease in the electrical noise of the electroacoustic transducer. This decrease in the electrical noise is obtained with a minimal increase in the cost of the sensor due solely to the production of the perforations and without an increase in the volume of piezoelectric material, in particular in the thickness of piezoelectric material. As a result, the hydrophone according to the invention exhibits better performance at high frequencies.

The fact that, in the proposed solution, piezoelectric plates with 3-1 connectivity are used is very advantageous. Specifically, when using a monolithic plate of 1-3 or 2-2 composite piezoelectric material, in which the interstices between the uniform rods or bars are filled with a polymer filler material, the sensitivity gain of the elementary sensor is reduced, mainly because of the non-negligible stiffness of the polymer material with respect to that of the piezoelectric material. The choice of the piezoelectric material of the 1-3 or 2-2 composite is restricted to piezoelectric ceramics, having sufficient stiffness with respect to that of the typical filler materials, and excludes piezoelectric polymers. In the case of composite plates with 3-1 connectivity, the filler material is fully encapsulated by the rigid electrodes in the vertical direction and by the piezoelectric material in the lateral directions, and is subject to stresses that are low with respect to the ambient pressure. This allows the perforations to be filled with an extremely flexible material, such as an open cell foam, a gas or even vacuum. In general, when a solid is used as the filler material, good results are obtained when the Young's modulus of the filler material is less than quarter of the Young's modulus of the piezoelectric material defined perpendicularly to the plane of the layer. When a fluid is used as the filler material, its modulus of isotropic compressibility is advantageously less than quarter of the modulus of isotropic compressibility of the piezoelectric material. An open cell foam, or just air, exhibits very low stiffness and provides maximum decoupling that is close to that of vacuum. Sensitivity gain is thus maximized. The choice of the piezoelectric material in the 3-1 composite may be extended to piezoelectric polymers such as PVDF. Throughout the rest of the text, the hydrophone according to the invention may be referred to as a multilayer hydrophone with perforated piezoelectric plates or 3-1 composite piezoelectric plates.

The capacitance of the hydrophone is also reduced with respect to a multilayer uniform sensor. Consequently, the invention is particularly suitable for low sensitivity, high permittivity materials such as 1-3 composites. The piezoelectric matrix of the 3-1 composite then consists of 1-3 composite.

The hydrophone with perforated piezoelectric plates retains most of the advantages of the hydrophone with uniform plates: an absence of resonant mode in the band, low manufacturing dispersion, low accelerometric sensitivity, a continuous acoustic surface and, potentially, large size. The static pressure resistance is decreased due to the amplification of stress in the piezoelectric material. It is nonetheless easily still sufficient for operational requirements.

Advantageously, at least one piezoelectric layer comprises at least one unitary plate of piezoelectric material comprising a central zone that comprises a plurality of perforations, said central zone integrating said perforations in the plane of the layer and at least partially integrating said perforations along the direction of stacking. The piezoelectric layer comprises a single unitary plate integrating the perforations. In a variant, the layer comprises a plurality of unitary plates as defined above, which plates are stacked along the direction of stacking so that the perforations of the plates are superposed in the direction of stacking so as to form the perforations of the piezoelectric layer.

The difference in cost between this solution and the multilayer sensor with uniform plates is very small, since the only difference in cost resides in the production of perforations in the piezoelectric layer.

Furthermore, it allows the simple and inexpensive method for manufacturing the uniform sensor to be retained, which method consists in producing a simple stack of the plate of unitary piezoelectric material and of the electrodes.

The perforations are separated by bars that are joined to one another. This solution thus avoids problems relating to the relative positioning of the perforations and, in particular, having to use a complex tool which would be needed to position independent bars. This solution makes it possible to avoid having to add additional elements to the ends of the perforations in order to ensure that they close tight and ensure the pressure resistance of the device, which would involve additional complexity and manufacturing time for the sensor.

Advantageously, the layer comprising the central zone comprises a uniform piezoelectric frame that completely surrounds the central zone, the uniform frame being made of a piezoelectric material.

The hydrophone according to the invention differs from a multilayer hydrophone using porous PVDF plates in
the topology of the inclusions of filler material:
having a connectivity of 0 (imprisoned within the bulk) in the case of porous PVDF (3-0 composite);
having a connectivity 1 (being open in direction 3) in the case of perforated PVDF (3-1 composite),
the scale of the inclusions of filler material:
being microscopic (<0.1 mm) in the case of porous PVDF;
being macroscopic 0.1 mm) in the case of perforated PVDF,
a greater possibility for the fraction of filler material per unit volume to be adjusted with perforated PVDF, allowing the sensitivity/capacitance trade-off to be adjusted.

Since porous PVDF has a high Poisson's ratio, it has the potential to be substantially improved by perforation (an important difference between g3t and g33). This potential is nonetheless limited by the lower pressure resistance of this material.

The hydrophone according to the invention differs from the 3-1 piezocomposite in:
the relative directions of connectivity of the inclusions and of polarization, which are
perpendicular for the 3-1 piezocomposite;
parallel for the proposed solution according to the invention,
rigid plates, which
do not form part of the 3-1 piezocomposite, which means that the perforations have to be filled with a solid material such as a polymer;
form an integral part of the proposed solution according to the invention, allowing the filler to be any material, in particular air.

Advantageously, at least one piezoelectric layer comprises a single unitary plate of piezoelectric material.

Advantageously, at least one piezoelectric layer comprises an elementary stack produced along the direction of stacking of a plurality of unitary plates of piezoelectric material, each unitary plate comprising a central zone that comprises a plurality of perforations, the plates being stacked so that the perforations of said plates are superposed in the direction of stacking.

Advantageously, each rigid layer extends over the entirety of the surface of each piezoelectric layer that is contiguous with said rigid layer in the stack.

Advantageously, at least one piezoelectric layer comprising a central zone that comprises a set of perforations is made in a simple orthotropic piezoelectric material drawn out along the longitudinal direction, such as PVDF.

Advantageously, at least one piezoelectric layer comprising a central zone that comprises a set of perforations is made in a material having a Young's modulus that is higher than or equal to 10 GPa and a Poisson's ratio that is higher than or equal to 0.35, and is made in particular of PZT, copolymer or PVDF.

Advantageously, at least one piezoelectric layer comprising a central zone that comprises a set of perforations is made from a 1-3 piezocomposite material.

Advantageously, the perforations are separated pairwise by bars of piezoelectric material and in which at least one piezoelectric layer comprising a central zone that comprises a set of perforations is dimensioned so that an aspect ratio of the bars, defined by the ratio of the thickness of the piezoelectric layer to the width of the bars comprised in the central zone along a direction that is perpendicular to the longitudinal direction and to the direction of stacking of said layer, is at least equal to 0.25.

Advantageously, the piezoelectric layer is formed in a material exhibiting transverse isotropy perpendicularly to the direction of stacking and the perforations extend similarly in two directions that are perpendicular to the direction of stacking.

Alternatively, the piezoelectric layer may be formed in a material exhibiting transverse anisotropy perpendicularly to the direction of stacking and in which the perforations extend mainly in a direction that is perpendicular to the direction of stacking.

Advantageously, the perforations are positioned regularly in two directions that are perpendicular to the direction of stacking.

Another subject of the invention is a receiving array comprising a plurality of hydrophones according to the invention.

Yet another subject of the invention is a method for producing a hydrophone according to the invention, in which the perforations are produced by cutting a unitary piezoelectric material.

Advantageously, the piezoelectric material is polarized before production of the perforations by cutting.

BRIEF DESCRIPTION OF THE DRAWINGS

Other features and advantages of the invention will become apparent on reading the detailed description which follows, given by way of non-limiting example and with reference to the appended drawings in which.

From one figure to another, the same elements bear the same references.

DETAILED DESCRIPTION

The invention relates to a hydrophone configured to operate in push-pull mode. This type of hydrophone is designed to be subjected to the same pressure on all faces thereof. It is therefore configured to have an operating frequency domain in which its size is much smaller than the wavelength of the acoustic waves detected.

This type of hydrophone is in contrast to hydrophones intended to operate by flexing, such as the hydrophones referred to as cantilever beam hydrophones that are intended to detect differences in pressure between their opposite faces.

The hydrophone according to the invention may be intended to be submerged at great depth. In this case, it must resist high hydrostatic pressures, for example at least 30 bar.

Figure 1:
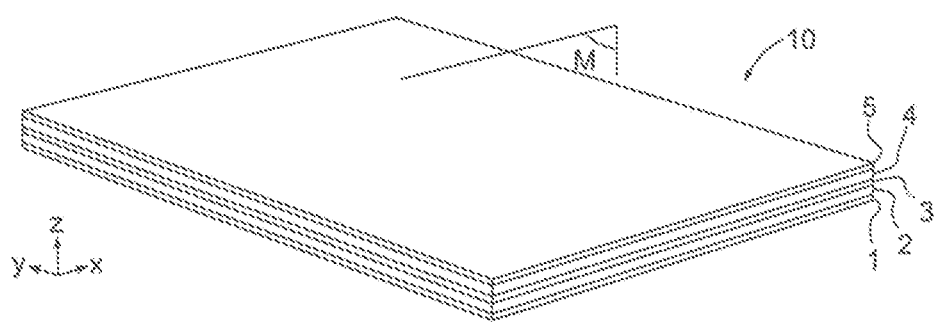
FIG. 1 is a schematic representation in perspective of a first example of a hydrophone according to the invention.

FIG. 1 shows a schematic representation in perspective of an example of a hydrophone according to the invention. This hydrophone comprises a stack 10 of layers 1 to 5, for example assembled by bonding. Other means of assembly are possible, such as in particular by polymerization of one of the constituent materials of the hydrophone. The stack 10 is produced along a direction of stacking z. Moreover, directions x and y, perpendicular to one another and to the direction of stacking z, are defined. The layers extend in planes containing the directions x, y and comprise three layers, referred to as rigid layers 1, 3, 5, and two layers of piezoelectric material 2, 4. The rigid layers 1, 3, 5 may be electrodes. In this case, they are electrically conductive layers, for example made of metal, electrically connected in parallel or in series by electrical connections which are not shown in FIG. 1. Each piezoelectric layer 2, 4 is interposed, i.e. sandwiched, between the two rigid layers 1 and 3 on one side and 3 and 5 on the other side. Each piezoelectric layer is bonded to the two rigid layers that surround it. It is possible for a rigid layer not to be conductive and to have solely a mechanical lateral stiffening function.

Figure 2:
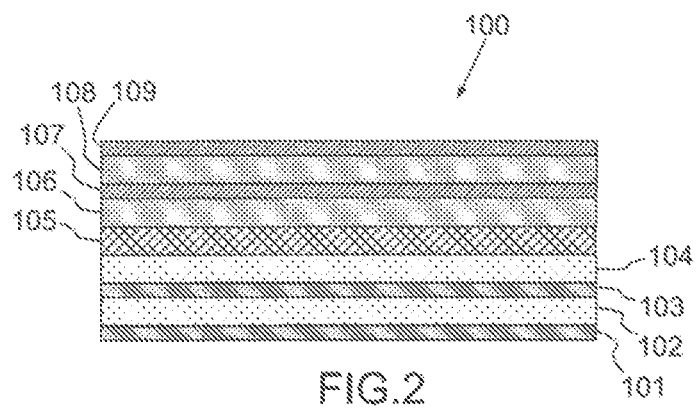
FIG. 2 is a schematic representation in cross section of a second example of a hydrophone according to the invention.

In general, the stack 10 comprises a plurality of rigid layers at least two of which are electrode layers. In the stack shown, a piezoelectric layer and a rigid layer are stacked in alternation. It is also possible to produce a stack with successive layers of the same type. The stack comprises at least one piezoelectric layer and two rigid layers. The embodiment of FIG. 2 shows a view in cross section in a plane containing the direction z of stacking of a second example of a stack 100 comprising a plurality of layers of piezoelectric material 102, 104, 106, 108 and a plurality of rigid layers 101, 103, 105, 107, 109, which are all electrodes that are electrically connected to one another in series and/or in parallel. The layers of piezoelectric material are not all made in the same piezoelectric material. The rigid layers are not all made in the same material. The layers are not all of the same thickness. In a variant, all of the layers of piezoelectric material are made in the same material and/or are of the same thickness and/or all of the rigid layers are made in the same material and/or are of the same thickness.

The term "rigid layers" is understood to mean layers having stiffnesses that are higher than the stiffness of the adjacent layer(s) of piezoelectric material perpendicularly to the direction of stacking. The stiffness of a layer of a material is here defined as the product of its Young's modulus and its thickness. One of the functions of these rigid layers is to limit the lateral deformation of the piezoelectric material, thereby allowing lateral stresses, i.e. those perpendicular to the direction z, to be decreased, and hence to provide the hydrophone with a good effective dielectric constant. This effect is already present in the sensor with uniform plates. In the sensor with perforated plates according to the invention, the effect is present in the uniform peripheral zone, and in the perforated central zone in the directions in which there is no lateral decoupling. This effect increases the stiffer the rigid layers are with respect to the piezoelectric material. In the rigid layers, tensile and compressive lateral stresses due to flexing are observed. Another function of the rigid layers is to minimize flexural deformation in line with the perforations in order to homogenize the deformation along the direction of stacking z of the piezoelectric material and of the filler material and thus to amplify the tensile stress along the direction z in the piezoelectric material. In-house tests have shown that the hydrophone operates well with a ratio of the stiffness of a rigid layer to the stiffness of an adjacent piezoelectric layer that is higher than or equal to 2.5. Electrodes made of Al, Cu—Be or Cu—Sn with an overall thickness of around 75% of the overall thickness of the layers of piezoelectric material meet this condition in the case in which the piezoelectric material is a polymer or a piezoelectric composite.

The rigid layers comprise at least two electrodes and may comprise other rigid layers the sole function of which is to limit the lateral deformation of the layers of piezoelectric material. These layers therefore meet the required stiffness conditions defined in the preceding paragraph but are not electrically connected to one another or to the electrodes.

The electrode layers are conductive layers, for example metal layers made, for example, of aluminum, CuBe alloy or CuSn alloy. The other rigid layers are not necessarily conductive.

Figure 3:
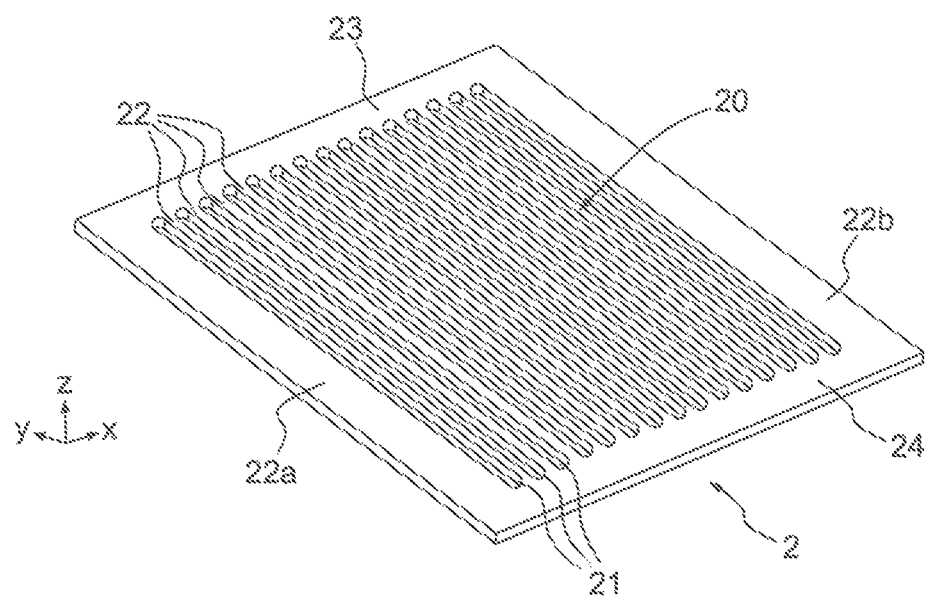
FIG. 3 is a schematic representation in perspective of a piezoelectric layer with 3-1 connectivity of the hydrophone shown in FIG. 1.
Figure 4:
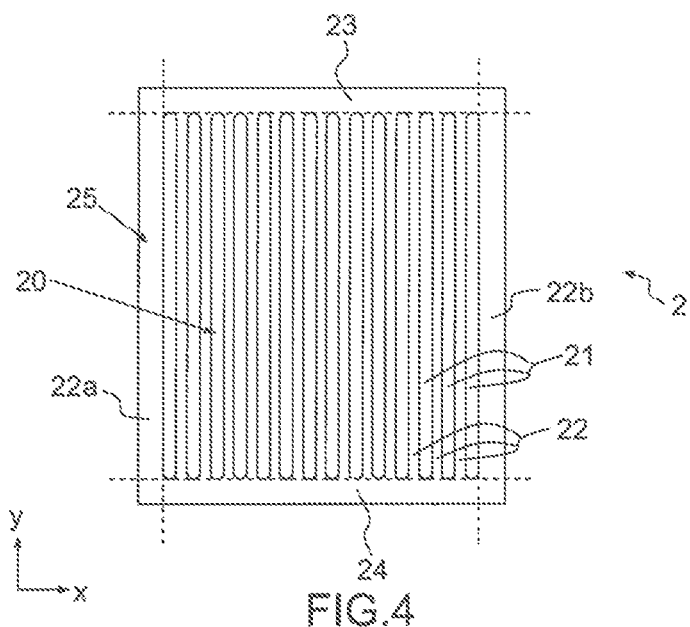
FIG. 4 is a schematic representation viewed from above of the piezoelectric layer with 3-1 connectivity of FIG. 3.

FIGS. 3 and 4 are schematic representations in perspective and viewed from above, respectively, of a piezoelectric layer 2 of the example of a hydrophone shown in FIG. 1. Advantageously, but not necessarily, the layers 2 and 4 are identical.

This layer 2 is a plate comprising a central zone 20, referred to as the perforated central zone, comprising a set of perforations in the form of grooves 21 that extend longitudinally along a direction, referred to as the longitudinal direction y, perpendicular to the direction of stacking z. The term "grooves" is understood to mean holes of elongated shape. The grooves are substantially parallel to one another. The grooved central zone 20 is delimited by two grooves. It is defined by the dotted lines in FIG. 4. Each groove 21 is delimited, along the direction x, by bars 22 of piezoelectric material extending longitudinally along the direction y. The bars 22 extend across the entire thickness of the plate 2 of piezoelectric material. They close the grooves tight along the direction x across the entire thickness of the plate. Each groove 21 is delimited, at its two longitudinal ends, by heels 23, 24 that extend continuously along the entirety of the central zone 20 along the direction x. The heels 23, 24 extend continuously across the entire thickness of the plate 2 so as to close the grooves tight along the direction y across the entire thickness of the plate 2.

The rigid layers 1, 3 that are contiguous to the layer 2 extend across the entire surface of the central zone 20. In the embodiment of the figures, these rigid layers 1, 3 extend continuously across the entire surface of the central zone 20.

The grooves 21 pass through the layer 2 along the direction z. Stated otherwise, the grooves 21 open on the two rigid layers 1 and 3.

Figure 5:
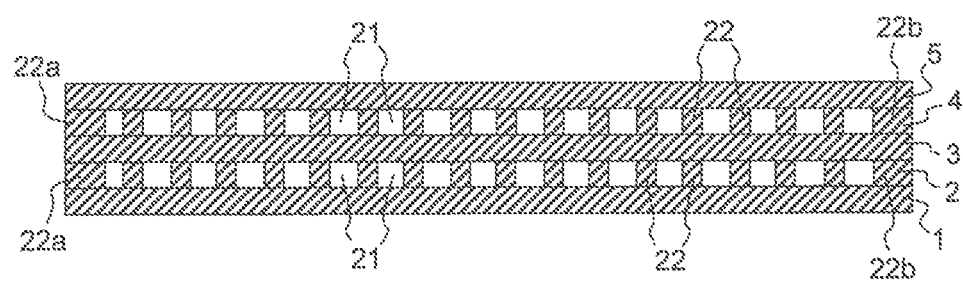
FIG. 5 is a cross-sectional representation of the hydrophone of FIG. 1 along the plane M, in the case of perforations with a high length/width aspect ratio.
Figure 6:
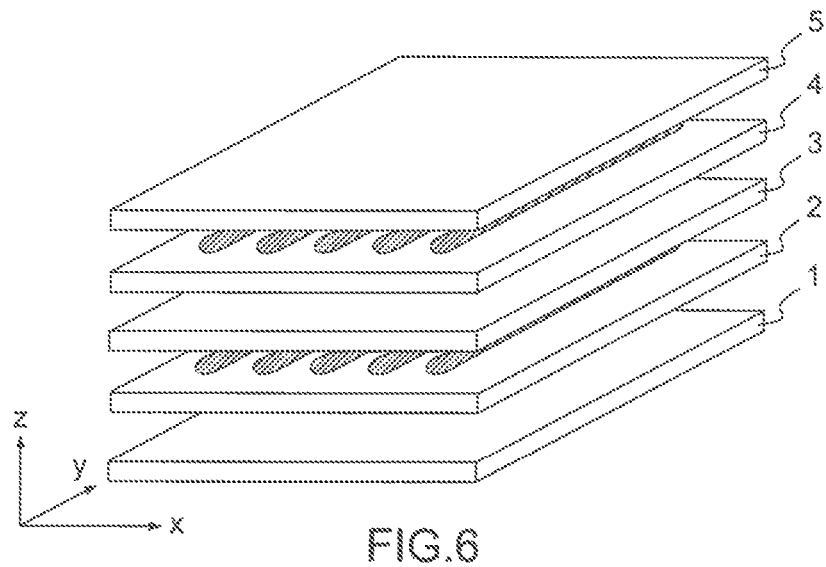
FIG. 6 is a representation in exploded perspective of the hydrophone of FIG. 1, in the case of perforations with a high length/width aspect ratio.

Thus, in the stack, as can be seen in FIG. 5, each groove 21 forms a perforation that is closed tight by closure elements comprising portions of the two rigid layers 1, 3, i.e. the two rigid layers that are contiguous with, i.e. bonded to, the piezoelectric layer 2. FIG. 6 is a representation in exploded perspective of the hydrophone of FIG. 1.

The closure elements also comprise the two bars 22 delimiting each groove 21 and the two heels 23, 24. Each groove 21 is filled at least partially with a filler fluid or a solid filler material the stiffness of which is substantially lower than that of the piezoelectric material. The filler fluid is for example air. The perforations open on each of the rigid layers that are contiguous with the layer 2, preferably at least over the majority of the length of the grooves. Stated otherwise, when bonding the contiguous layers, adhesive is able to penetrate into the grooves and partially fills them. The width of the grooves along the direction x and the fluidity of the adhesive are advantageously chosen so that the adhesive does not penetrate or only marginally penetrates into the grooves. Each perforation advantageously extends at least over the majority of the length of the groove in which it is included. The width of the grooves and the fluidity of the adhesive are chosen so that the perforations open on each of the rigid layers that are contiguous with the layer 2 over its entire length or at least over the majority of its length. This means that the adhesive does not close the perforations and does not separate them from the adjacent rigid layers.

A function of the perforations is to provide lateral decoupling in the perpendicular direction x, thus allowing the piezoelectric material to operate in a more favorable mode than in a multilayer sensor with uniform plates and allowing the sensitivity of the sensor to be improved with respect to the multilayer sensor with uniform plates.

In the embodiment of FIGS. 3 and 4, the plate 2 of piezoelectric material is unitary. Stated otherwise, the plate 2 is formed from a single piece of piezoelectric material. The plate 2 comprises a grooved central zone 20 and a peripheral zone 25 closing the grooves tight across the entire thickness of the plate. An advantage of this embodiment is that it allows the stack to be produced by simply stacking inexpensive plates while ensuring the tightness of the air-filled perforations.

Advantageously, the peripheral zone 25 is uniform. It forms a frame made of piezoelectric material that completely surrounds the grooved central zone 20. The uniform frame 25 is formed from the two heels 23, 24 and from the bars 22a, 22b surrounding the grooved central zone.

In this embodiment, the peripheral zone operates in thickness mode. An advantage of the frame is that it provides good pressure resistance. An advantage of this embodiment, in which the frame is made of a piezoelectric material, is that it maximizes the active area of the piezoelectric layer. The extra cost of this type of solution with respect to the multilayer sensor with uniform plates is insubstantial since it is solely linked to the production of the grooves in the monolithic plates used in the multilayer sensor with uniform plates.

The grooves 21 are for example produced by machining a uniform plate. The plate may, in a variant, be obtained by molding, allowing a grooved plate to be obtained directly.

In a variant, the layer 2 of piezoelectric material comprises an elementary stack of multiple unitary plates, such as described above, produced along the direction of stacking z. The plates are stacked so that the grooves of the plates are superposed along the direction of stacking so as to form the perforations. Each channel of the piezoelectric layer is then formed in a stack of grooves produced in the stacked plates. The plates forming a piezoelectric layer comprise the same number of grooves of the same size and are positioned so that the grooves occupy the same positions in the plane x, y. In this way, the grooves form thick grooves extending across the entire thickness of the layer and opening on either side of the piezoelectric layer.

In a variant, the hydrophone comprises at least one piezoelectric layer which is not unitary. Stated otherwise, the bars delimiting the perforations do not form a unitary part but consist of an assembly of parts. This layer comprises perforations that are separated by independent bars made of piezoelectric material. The layer comprises elements for closing the perforations at their ends. The perforations are for example closed at their ends by independent filler elements that are inserted between two successive bars so as to plug one end of the perforation, or else they are closed by two filler parts each forming a comb comprising teeth that are inserted between two successive bars. The closure elements are for example made of a piezoelectric material, or else in a non-piezoelectric material such as a polymer.

Advantageously, at least one layer of piezoelectric material comprises a peripheral zone forming a uniform frame that completely surrounds the central zone comprising the perforations.

In the case in which at least one piezoelectric layer comprises a peripheral zone forming a uniform frame that completely surrounds the central zone comprising the perforations, the stiffness and the thickness of the electrodes are chosen so as to be sufficiently rigid with respect to the thickness and the stiffness of the piezoelectric material in order to ensure that the piezoelectric material operates in blocked mode in the uniform zone. This means that lateral deformations are entirely prevented, or almost entirely prevented, in this zone. The rigid layers block lateral deformation.

In general, the rigid layers make it possible to block the lateral deformation of the piezoelectric material in the longitudinal direction y in the central zone, to minimize flexural deformation in line with the grooves, to maximize the transfer of forces and to amplify the stress in the bars.

Advantageously, as shown in FIG. 1, each rigid layer 1, 3 and 5 extends over the entire surface of each layer 2 of piezoelectric material that is bonded to or contiguous with the rigid layer 1, 3, 5. This allows the performance of the hydrophone to be enhanced by making use of the entire active area of each piezoelectric layer when measuring the acoustic pressure exerted on the faces of the hydrophone.

In a variant, at least one rigid layer extends over a portion of the surface of at least one contiguous piezoelectric layer. The important point is that the rigid layers extend over the entire surface of the central zone, comprising the perforations, of each adjacent piezoelectric layer. This makes it possible to ensure that the perforations are closed tight when they are filled with fluid.

Advantageously, each rigid layer is a unitary layer.

The piezoelectric layers may be made in uniform or composite piezoelectric materials. This may be a piezoelectric material with single orthotropy, for which the elastic and piezoelectric properties are identical along the x and y axes, such as stress-polarized PVDF. It is also possible to implement a material with double orthotropy, for which the elastic and piezoelectric properties differ along the x and y axes, such as porous PVDF, copolymers such as P(VDF-TrFE), 1-3 composites and PZT ceramics. With materials such as porous PVDF, copolymers and 1-3 composites, the gains in sensitivity and factor of merit, although less spectacular, lead to still further improved levels of sensitivity and electrical noise. However, this increase in performance is obtained at the price of an increase in supply cost and, in certain cases, of a decrease in the submersion range, for example in the case of porous PVDF.

The decrease in the electrical noise of the sensor is maximized through the use of materials exhibiting single orthotropy and a high Poisson's ratio, for example stress-polarized PVDFs. In the case of materials with single orthotropy, the perforations should extend longitudinally along a direction y that is perpendicular to the draw direction of the material with single orthotropy. Stated otherwise, the draw direction of the material is the direction x. In this case, the lateral decoupling is total along the x and y directions, the piezoelectric material operates virtually in deformation mode 33, i.e. in longitudinal mode along the axis of stacking z. In this type of sensor, it is observed that, in the central portion of the grooved zone, the lateral stress is almost zero.

Advantageously, the one or more piezoelectric layers are produced in a material having a Young's modulus that is higher than or equal to 10 GPa and a Poisson's ratio that is higher than or equal to 0.35. A material fulfilling these conditions provides the piezoelectric layers with rigidity and allows the sensitivity of the hydrophone to be further improved with respect to the prior art. Among rigid materials, PZT, copolymer or PVDF may be used in particular.

Advantageously, the aspect ratio of the bars made of piezoelectric material in the central zone is defined by the thickness of the piezoelectric layer, i.e. the thickness of the bars, divided by the width lb of the bars comprised in the central zone. Advantageously, the aspect ratio is at least equal to 0.25. This makes it possible to provide a state of zero lateral stress in the bars. This aspect ratio may be limited by the method for producing the grooves.

The sensitivity gain is even more substantial the higher the proportion of the area occupied by the perforations over the surface of the dielectric material layer perpendicularly to the direction of stacking. However, the requirement for pressure resistance necessitates a minimum uniform strip. Advantageously, the proportion of the area occupied by the perforations over the overall surface of the dielectric material layer perpendicularly to the direction of stacking depends on the use of the hydrophone. The sensitivity Sh increases and the capacitance Ch decreases as the area occupied by the perforations increases in size.

Using layers of PVDF material drawn under stress, the applicant has been able to demonstrate that, with the increase in sensitivity with respect to a multilayer hydrophone with uniform plates having the same number of layers made in the same materials and having the same size, the increase in sensitivity reaches up to +10 dB, and the decrease in the capacitance Ch remains less than 3 dB, for a clear increase in the factor of merit of up to +7 dB (namely a decrease in the electrical noise of the sensor by −7 dB for a constant volume).

Figure 7A:
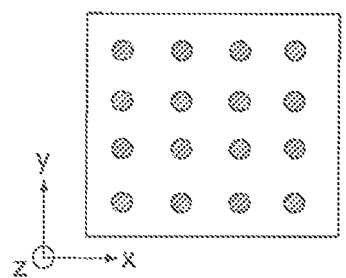
FIGS. 7a to 7d are representations of variants of the piezoelectric layer, in the case of perforations with a low length/width aspect ratio.

FIGS. 7a to 7d are representations of variants of the piezoelectric layer 2 in which the perforations are of various shapes. In FIG. 7a, the perforations are circular in cross section, in FIG. 7b, the cross section of the perforations is akin to that of FIGS. 1 to 6, in FIG. 7c, the perforations are square in cross section and, in FIG. 7d, the perforations are triangular in cross section. As above, the perforations of FIGS. 7a to 7d pass through the piezoelectric layer 2 from one side to the other. They extend along the direction of stacking z. The perforations form inclusions filled with filler material. In the various variants, the piezoelectric layer 2 forms a composite with 3-1 connectivity. More specifically, the piezoelectric material has a connectivity of 3: it is continuous along the three directions x, y and z. The filler material has a connectivity of 1: it is continuous only along the direction of stacking z.

Figure 7B:
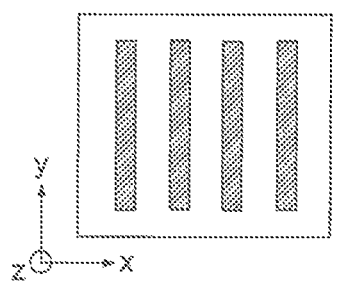
Figure 7C:
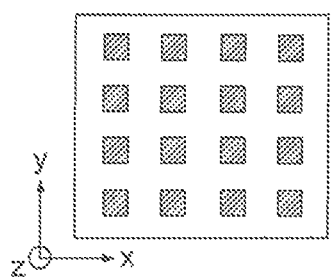
Figure 7D:
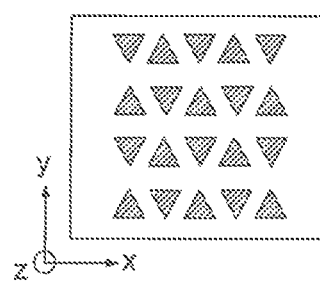

It is possible to distinguish between the perforations of FIG. 7b, which extend mainly along the direction y, and the perforations of FIGS. 7a, 7c and 7d, which extend in the same way in the directions x and y. The perforations of low length/width aspect ratio (FIGS. 7a, 7c and 7d) are well suited to a piezoelectric material exhibiting transverse isotropy (in the directions x and y). The perforations of high length/width aspect ratio (FIG. 7b) are well suited to a piezoelectric material without transverse isotropy, such as a drawn material. The largest dimension of the perforations is then advantageously perpendicular to the draw direction of the piezoelectric material.

In FIGS. 7a to 7d, the perforations are positioned regularly along the directions x and y. A regular positioning provides greater uniformity of stresses in the piezoelectric material and thus improves its pressure resistance. It is also possible to position them irregularly or randomly. Moreover, the perforations shown are all identical in one and the same variant. Alternatively, it is possible to produce perforations of different shapes in one and the same layer 2.

Another subject of the invention is an array comprising a plurality of hydrophones according to the invention.

Yet another subject of the invention is a method for producing a hydrophone according to the invention, in which the perforations 21 are produced by cutting a unitary piezoelectric material. The cutting operation is for example carried out by means of machining using a cutting tool or by means of laser machining. Any other method for removing material that is suitable for a piezoelectric material may be implemented. The cutting operation allows different patterns to be produced on one and the same plate. For example, it could be advantageous to increase the size of the perforations in the center with respect to the edges of the plate.

The polarization of the piezoelectric material is generally oriented in parallel to the direction z of stacking of the layers and hence in parallel to the direction of the perforations 21. Advantageously, the piezoelectric material is polarized before production of the perforations by cutting. The polarization of the piezoelectric material is for example established when it is being shaped by drawing. The piezoelectric material is drawn between two rollers. A high voltage is applied between the rollers or potentially between the rollers and a conductive layer present inside an elementary stack forming the piezoelectric layer. The applied voltage generates an electric field for the purpose of polarizing the piezoelectric material. It is also possible to polarize the piezoelectric material independently of its drawing.

Among the possible cutting methods for a piezoelectric material, a method generating a low rise in temperature is favored in order to avoid a partial depolarization of the material at the cutting edges.

The invention claimed is:

1. A hydrophone configured to operate in push-pull mode comprising a stack of layers that are bonded to one another, the stack being produced along a direction of stacking (z), the layers comprising at least one piezoelectric layer and a plurality of layers referred to as rigid layers, at least two of which are electrode layers, in which the rigid layers exhibit a stiffness perpendicularly to the direction of stacking, which stiffness is higher than a stiffness of the piezoelectric layer perpendicularly to the direction of stacking, at least one piezoelectric layer comprises a central zone comprising a set of perforations that pass through the piezoelectric layer solely along the direction of stacking, each perforation being closed tight by closure elements comprising portions of two of said rigid layers, said two rigid layers extending over the entirety of the surface of the central zone, and in which the perforations are filled with a filler material forming, with a piezoelectric material of the layer, a composite with 3-1 connectivity.

2. The hydrophone as claimed in claim 1, wherein a ratio of the stiffness of a rigid layer to the stiffness of an adjacent piezoelectric layer is higher than or equal to 2.5.

3. The hydrophone as claimed in claim 1, wherein the filler material is a fluid the isotropic bulk modulus of which is less than a quarter of the isotropic bulk modulus of the piezoelectric material.

4. The hydrophone as claimed in claim 1, wherein the filler material is a solid the Young's modulus of which is less than a quarter of the Young's modulus of the piezoelectric material defined perpendicularly to the plane of the piezoelectric layer.

5. The hydrophone as claimed in claim 1, wherein the piezoelectric layer comprises the central zone and a uniform frame that completely surrounds the central zone, the uniform frame being made of a piezoelectric material.

6. The hydrophone as claimed in claim 1, wherein at least one piezoelectric layer comprises a single unitary plate of piezoelectric material.

7. The hydrophone as claimed in claim 1, wherein at least one piezoelectric layer comprises an elementary stack produced along the direction of stacking of a plurality of unitary plates of piezoelectric material, each unitary plate comprising a central zone that comprises a plurality of perforations, the plates being stacked so that the perforations of said plates are superposed in the direction of stacking.

8. The hydrophone as claimed in claim 1, wherein each rigid layer extends over the entirety of the surface of each piezoelectric layer that is contiguous with said rigid layer in the stack.

9. The hydrophone as claimed in claim 1, wherein at least one piezoelectric layer comprising a central zone that comprises a set of perforations is made in a simple orthotropic piezoelectric material drawn out along the longitudinal direction, such as PVDF, or in a double orthotropic piezoelectric material such as copolymers.

10. The hydrophone as claimed in claim 1, wherein at least one piezoelectric layer comprising a central zone that comprises a set of perforations is made in a material having a Young's modulus that is higher than or equal to 10 GPa and a Poisson's ratio that is higher than or equal to 0.35, and is made in particular of PZT.

11. The hydrophone as claimed in claim 1, wherein at least one piezoelectric layer comprising a central zone that comprises a set of perforations is made from a 1-3 piezocomposite material.

12. The hydrophone as claimed in claim 1, wherein the perforations are separated pairwise by bars of piezoelectric material and wherein at least one piezoelectric layer comprising a central zone that comprises a set of perforations is dimensioned so that an aspect ratio of the bars, defined by the ratio of the thickness of the piezoelectric layer to the width of the bars comprised in the central zone along a direction that is perpendicular to the longitudinal direction and to the direction of stacking of said layer, is at least equal to 0.25.

13. The hydrophone as claimed in claim 1, wherein the piezoelectric layer is formed in a material exhibiting transverse isotropy perpendicularly to the direction of stacking and wherein the perforations extend similarly in two directions that are perpendicular to the direction of stacking.

14. The hydrophone as claimed in claim 1, wherein the piezoelectric layer is formed in a material exhibiting transverse anisotropy perpendicularly to the direction of stacking and wherein the perforations extend mainly in a direction that is perpendicular to the direction of stacking.

15. The hydrophone as claimed in claim 1, wherein the perforations are positioned regularly in two directions that are perpendicular to the direction of stacking.

16. A receiving array comprising a plurality of hydrophones as claimed in claim 1.

17. A method for producing a hydrophone as claimed in claim 1, wherein the perforations are produced by cutting a unitary piezoelectric material.

18. The method as claimed in claim 17, wherein the piezoelectric material is polarized before production of the perforations by cutting.

* * * * *